United States Patent [19]

Jaunin

[11] 4,400,093

[45] Aug. 23, 1983

[54] METHOD FOR INSPECTING THE RUNNING OF A TIMEPIECE AND TIMEPIECE ADAPTED FOR SUCH METHOD

[75] Inventor: Jean-Pierre Jaunin, La Neuveville, Switzerland

[73] Assignee: OMEGA Louis Brandt & Frere S.A., Bienne, Switzerland

[21] Appl. No.: 394,061

[22] Filed: Jul. 1, 1982

[30] Foreign Application Priority Data

Jul. 6, 1981 [CH] Switzerland ........................ 4422/81

[51] Int. Cl.[3] ...................... G04C 13/08; G04B 27/00; H03K 1/16; G04C 9/00

[52] U.S. Cl. .................................... 368/200; 368/69; 368/85; 368/155; 368/217

[58] Field of Search ............... 368/200, 201, 202, 155, 368/156, 69, 70, 85, 86, 217, 218, 219

[56] References Cited

U.S. PATENT DOCUMENTS

| | | | |
|---|---|---|---|
| 3,777,471 | 12/1973 | Koehler et al. | 368/201 |
| 3,895,486 | 7/1975 | Hammer et al. | 368/201 |
| 3,914,706 | 10/1975 | Hammer et al. | 331/1 A |
| 4,051,663 | 10/1977 | Chihara et al. | 368/200 |
| 4,142,360 | 3/1979 | Akahane | 368/201 |
| 4,150,536 | 4/1979 | Nakajima et al. | 368/200 X |
| 4,173,863 | 11/1979 | Motoki et al. | 368/200 X |
| 4,199,726 | 4/1980 | Bukosky et al. | 368/200 X |
| 4,292,836 | 10/1981 | Wiget | 73/6 |

FOREIGN PATENT DOCUMENTS

| | | |
|---|---|---|
| 2156368 | 5/1973 | France . |
| 2442467 | 6/1980 | France . |
| 534913 | 8/1972 | Switzerland . |
| 2043967 | 12/1979 | United Kingdom . |

*Primary Examiner*—J. V. Truhe
*Assistant Examiner*—Terrance Flower
*Attorney, Agent, or Firm*—Griffin, Branigan & Butler

[57] ABSTRACT

In order to determine the adjustment precision ΔT of a timepiece provided with an oscillator (1) and an adjustable frequency divider chain (3–18; 18–20) on which an adjustment unit (15) acts, initially the real period TQ of the oscillator is measured with the adjustment unit disconnected following a first actuation of a time setting circuit (21). A second actuation of said circuit then effects running of the display at a rate n times above the normal and the adjustment unit is connected. Following a time T/n representing the adjustment cycle the period TQ is measured as corrected by the amount nΔT, thus TQ+nΔT. The first measured value obtained is subtracted from the second thus giving nΔT which when divided by n gives the adjustment precision ΔT.

8 Claims, 1 Drawing Figure

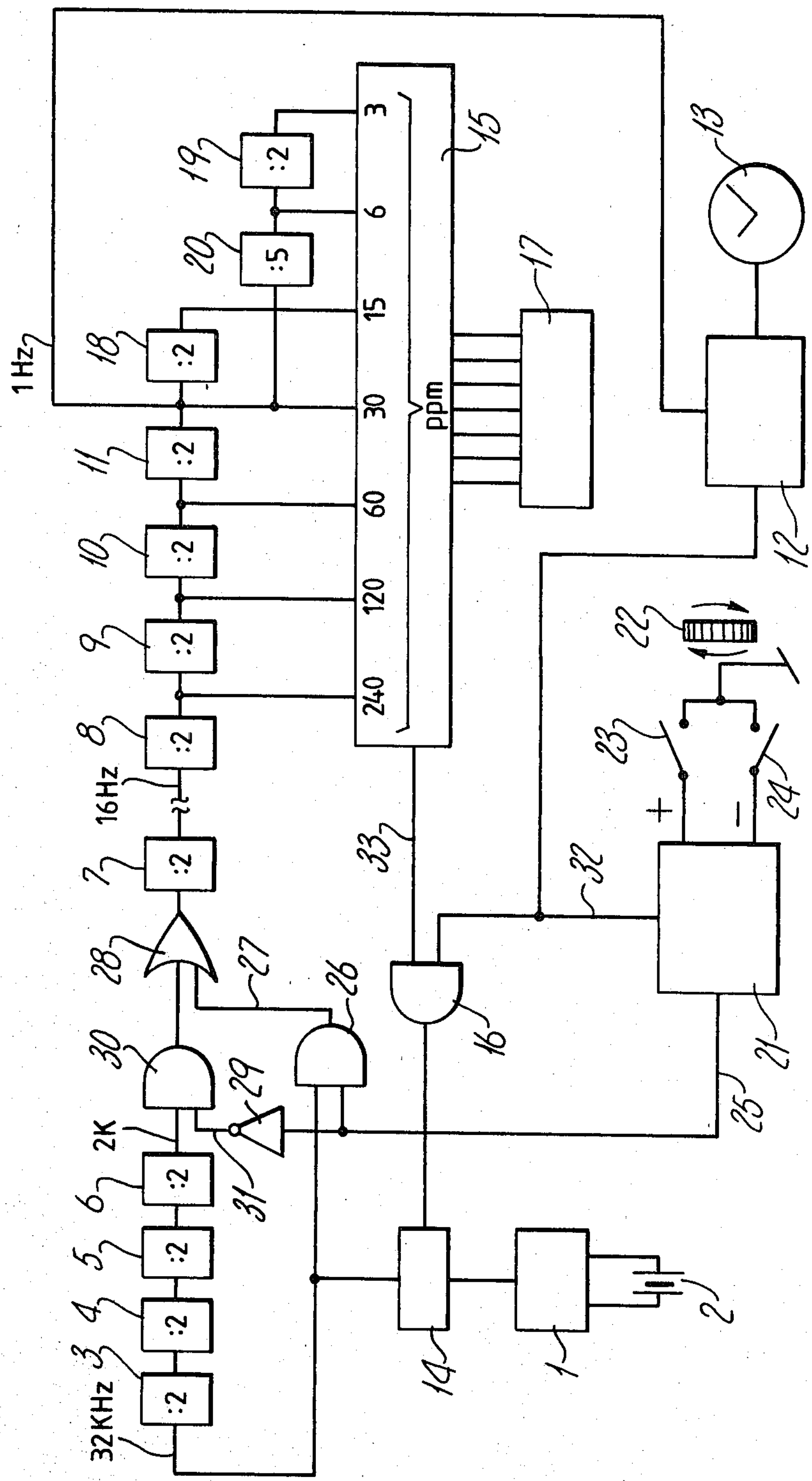
1 Hz
16Hz
32KHz
2K
:2
:5
ppm
3
6
15
30
60
120
240
+
−

METHOD FOR INSPECTING THE RUNNING OF A TIMEPIECE AND TIMEPIECE ADAPTED FOR SUCH METHOD

BACKGROUND OF THE INVENTION

The present invention concerns a method for determining the adjustment of a timepiece provided with an oscillator and an adjustment unit for the division rate of its frequency divider. It further concerns a timepiece arranged and adapted for application of the foregoing method.

Initially, it will be recalled that certain existing timepieces utilize, in order to adjust the frequency of their quartz oscillator which may be relatively stable but imprecise, an adjustment unit for the division rate of their divider chain which may be substituted for a trimmer utilized hitherto during numerous years. This substitution has brought about a certain progress by diminishing the energy consumption and the manufacturing price and through an improvement of the stability of operation. Examples of this technique are given in various invention publications. U.S. Pat. No. 3,895,486 describes an adjustment unit intended to inhibit a certain number of pulses among those supplied by the oscillator during a predetermined period. In this case the real frequency of the oscillator is chosen to be higher than its normal frequency. U.S. Pat. No. 3,777,471 describes an analogous system where the adjustment unit adds a certain number of pulses to those supplied by the oscillator, which the real frequency is in such case chosen to be lower than the normal frequency. In one or the other of these systems the adjustment unit is associated with a memory for which the state represents the magnitude of the adjustment to be realized.

The memory just mentioned may take the form of switches as in the case of the cited U.S. Pat. No. 3,895,486 or on the other hand may be formed of alterable electronic elements such as described in the U.S. Pat. No. 3,914,706. In either case, said memory stores in a coded form the information determining the division rate.

This being the case, the question arises to determine the running of the timepiece in order to introduce, during the manufacture for instance, the coded information necessary for the desired precision and good operation. The same question is posed to the watchmaker repairman who must be in a position to regulate the operation of a watch which either advances or retards. In order to do this, generally there is available apparatus permitting the detection of a signal emitted by the display system of the watch or of counters installed in the manufacturing assembly line in order to measure directly the signal present at the output of the frequency divider.

However, as the timepiece under consideration is provided with an adjustment unit intended to inhibit or to add a certain number of pulses during a predetermined period or adjustment cycle, the measurement of operation may take far too much time. Effectively, the correction signal which is introduced into the divider chain to modify the rate of division thereof is essentially aperiodic and it is necessary to await the end of a regulating period in order to obtain a correct measurement of the average running of the timepiece. In an example which will be described further on and for which the precision to be obtained is in the order of 3 ppm, it will be seen that this period may require up to 10 seconds, which period is incompatible with mass production of large series.

Various solutions have been proposed in order to overcome the difficulty and to shorten the measurement time. Thus, as shown in French patent publication No. 2 442 467 there is shown a logic circuit arranged to generate a measurement signal comprising pulses of which the distribution represents the division rate and the frequency of the oscillator. In this arrangement the operation of the timepiece is accelerated and one measures the period P of a noncorrected pulse train and the number N of pulses which are suppressed during this period (or, in other terms, the state of the memory). From this may be deduced by calculation the effect produced on the running of the timepiece. The British patent publication No. 2 043 967 describes a system of inspection of the state of a memory formed of switches. When a switch is operated, the display is driven at an accelerated speed which represents the contents of the memory.

The previously mentioned solutions present at least two difficulties. Initially, they resolve only a portion of the problem as posed. Effectively, if the two proposed methods are well adapted to provide a rapid inspection of the state to which the memory is regulated, on the other hand one knows nothing of the result or the effect which this may have on the state of the real running of the timepiece. This is due to the fact that in order to effect this inspection, the regulation exerted by the memory on the divider chain is suppressed. One is thus obliged to assume that, because the memory is to be found in a suitable state, the operation of the timepiece will be correct once the regulation has been re-established. However, nothing proves that for instance the inhibition circuit is functioning correctly, this being an absolute condition to obtain a good running of the timepiece as would be the case if the measurement was made with the circuit functioning. Following this, the proposed solutions will require special circuits to be added to the ordinary timekeeping circuits as well as a special control, these circuits and control being used only rarely whenever it is a matter of inspecting the running.

This invention proposes to overcome the aforesaid difficulties thanks to a method and a special timepiece executed in order to apply such method such as is hereafter defined in the claims.

BRIEF DESCRIPTION OF THE DRAWING

The single drawing attached hereto when read in the light of the description to follow, will give a full understanding of the operation of a timepiece properly equipped to carry out the method of the invention.

DETAILED DESCRIPTION OF THE INVENTION

The FIGURE is a schematic drawing of the principle of the timepiece according to the invention. This timepiece is provided with an oscillator 1 which is controlled by a quartz 2 for which the frequency has been chosen to be higher than the nominal (ideal) frequency of 32'768 Hz. The signal provided by the oscillator is introduced into the chain of fifteen divide-by-two circuits 3 to 11 which have only been partially shown on the FIGURE. Thus, at the output of divider 11, the nominal frequency will be found to be $32'768:2^{15}=1$ Hz. The signal 1 Hz is directed to a pulse forming circuit 12 in a manner such that a stepping motor drives the display 13 at one step per second. Interposed between oscillator 1 and the first frequency divider 3 will be found an inhibition circuit 14 for which the function is that of suppressing the excess pulses coming from the oscillator. The inhibition circuit is controlled by the output signal of an adjustment unit 15 for the division rate via an AND gate 16. The adjustment unit receives at its inputs, on one hand, information determining the division rate contained in memory 17 and, on the other hand, signals coming from the outputs of the last stages of the divider chain 8 to 11 as well as signals coming from three supplementary dividers 18 to 20. The inhibition circuit 14, adjustment unit 15 and memory 17 are not described here since they form the object of a detailed description which may be read in U.S. Pat. No. 3,895,486 cited above.

The timepiece comprises further a time setting circuit 21. This circuit may be controlled by a single push piece associated with a program or by several distinct push pieces intended for instance to add a unit to the number of seconds displayed, to block the advance of the display or again drive the display at a rate above its normal. In the preferred version of the invention as shown in the FIGURE, the control of the time setting circuit is obtained by means of a crown 22 which, when it is drawn into a certain axial position may activate the display in the clockwise sense (+) when it is turned in one sense and in the counter clockwise sense (−) when it is turned in the other sense, the advance or back running of the hands taking place at a speed above normal, for instance at a speed 16 times more rapid. When the crown is turned in one sense switch 23 is closed, while it is turned in the inverse sense switch 24 is closed.

From the FIGURE it will be seen that the rapid movement is obtained by short-circuiting certain dividers in the chain, thus dividers 3, 4, 5 and 6. The operation of the circuit is the following: the time setting circuit is arranged to provide a state 1 on its first output 25 when one or the other of switches 23 or 24 is closed. Output 25 is connected to the input of an AND circuit 26 which receives on its other input the pulses at 32 kHz coming from the oscillator. If the line 25 is in the state 1 there will be found thus at the output 27 of AND circuit 26 the same pulses at 32 kHz which via OR gate 28 are applied to divider 7. At the same time line 25 is connected to the input of an inverter 29 of which the output 31 is connected to the input of AND gate 30. If line 25 is in the state 1 it will be understood that gate 30 is blocked, thus preventing the passage of pulses coming from divider 6. Thus, in the example shown on the FIGURE, when one of the switches 23 or 24 is closed, the motor will be operated at a rate 16 times faster in view of the bridging of the four first dividers in the chain. It will be noted that in the normal mode of operation of the watch, line 25 is in state 0, which blocks AND gate 26 and opens AND gate 30 in order to place into the circuit the four first dividers 3 to 6 of the chain and thus to deliver a frequency of 1 Hz to the motor 13.

The time setting circuit 21 comprises further a second output 32 which may have two states: the state 0 when switch 23 is closed and state 1 when switch 24 is closed. This output is connected, on one hand, to the pulse forming circuit 12 in order to cause the motor to operate forwardly (state 0) or in the reverse (state 1) and, on the other hand, to AND gate 16. Thus, in the arrangement of the FIGURE, to the switch 23 when closed there corresponds the rapid advance operation of the motor as well as blocking of AND gate 16 and consequently the interruption of the control of the inhibition circuit 14 by the output signal 33 from the adjustment unit 15. In this situation the motor receives pulses from the oscillator for which the frequency is not corrected. In the same manner, to the closed switch 24, corresponds the rapid back running of the motor as well as the enabling of AND gate 16 and consequently the reestablishment of the control of the inhibition circuit 14 by signal on line 33. In this situation the motor receives its pulses from the oscillator of which the frequency is corrected by suppression of the excess pulses.

It will now be seen how one proceeds to inspect the adjustment precision of the timepiece in employing the arrangement which has just been described.

Designating by TQ the real period furnished by the oscillator without regulation and by Ti the nominal (ideal) period to be attained, one will find in the case of regulation by suppression of excess pulses:

$$TQ < Ti$$

or $$TQ + \Delta T = Ti$$

which is the same thing as saying that in the real period TQ it is necessary to add a nominal (ideal) period ΔT' in order to obtain the nominal period to be attained Ti.

In a first time, the real period TQ is measured without the accelerated regulation at a rate n times above the normal. For this measurement which will extend over a predetermined time, the switch 23 will be closed.

During a second time will be measured the real period TQ accelerated equally to a rate n times above the normal rate, but corrected by the real value of regulation ΔT, this value being multiplied by the acceleration factor n. In order to obtain this measurement, which will extend over the same predetermined time period, switch 24 is closed. One thus obtains the value TQ+nΔT.

By subtracting the first value obtained TQ from the second TQ+nΔT, there is obtained nΔT and it will be then sufficient to divide this by the factor n in order to obtain the value of the regulation ΔT which represents the adjustment precision.

It will be noted here that the period TQ may be measured without acceleration of the rate provided that thereafter, when it must be subtracted from the value TQ+nΔT, it is multiplied by the factor 1/n.

The predetermined period T during which the measurement of TQ and of TQ+nΔT extends corresponds to the duration which is necessary in order that an adjustment cycle be completely run through. In the case where the frequency of the oscillator is on the order of 32 kHz, this adjustment cycle will last 10 seconds, should one wish to obtain a regulation precision of 3 ppm. Effectively, if one suppresses a single 32 kHz pulse every 10 seconds, the oscillation time will be reduced by $$1{:}32.768\cdot 10^3 = 30\ \mu s \text{ by } 10^7\ \mu s,$$

that is to say, one may obtain an adjustment precision of 30 $\mu s{:}10^7\ \mu s = 3$ ppm. This last value enables the obtaining of a desirable precision of running of $$86'400\ \text{s/day}\cdot 3\cdot 10^{-6} = 0.259\ \text{s/day}$$

or, in other words, 7.77 s/month. It may naturally be desired to obtain a still greater precision, for instance 2.6 seconds per month, corresponding to a resolution of 1 ppm. In such case, the adjustment period T would extend over 30 seconds.

However this may be, as has been said above such periods T are too long to be acceptable to a rational manufacture of timepieces and for this reason the operation is effected at a rate much higher and one thus gains on the time necessary used for controlling the operation.

The schematic as shown enables when one or the other of switches 23 or 24 is closed, to accelerate the display speed sixteen times. Under these conditions, the duration of the adjustment cycle is brought from 10 seconds to T/n thus 10/16=625 ms. If it should be desired to shorten further this duration, it is possible to operate the display at a rate still more rapid by short-circuiting for instance five (acceleration of 32×) or six dividers (acceleration of 64×).

A practical numerical example will now be given. It may be supported that one is dealing with a timepiece which indicates seconds in normal operation and which is arranged according to the schematic. At the closing of switch 23 the adjustment unit 15 is disconnected and the operation of the display is effected at a rate 16 times more rapid than the standard by virtue of a signal of 16 Hz applied to the terminals of the motor winding. Since the adjustment cycle lasts 10 seconds, the period TQ as furnished by the oscillator will be measured over the accelerated equivalent T/n=T/16, that is to say, over ten periods of 16 Hz for which the duration would be valid if the period delivered by the oscillator were to be ideal 10·0.0625 s=625'000.0 μs. The measurement of the real period gives in reality 624'997.2 μs, this signifying an adjustment precision of 2.8 μs:625'000 μs=4.81 ppm. At the closing of switch 24, the adjustment unit 15 is connected, which acts via AND gate 16 on the inhibition circuit 14. At this point the value TQ+nΔT is measured, which gives 625'027.2 μs. One then subtracts the value obtained at the time of the first measurement from that obtained during the second measurement, thus 625'027.2 μs−624'997.2 μs=30 μs. This result is divided by the acceleration factor 16, thus 30 μs:16=1.87 μs, this expressing an adjustment precision of 1.87/625'000=3 ppm.

It will be noted that on the assembly line a special apparatus developed for this type of measurement will be used. In particular, it will be provided with a time base delivering the adjusting cycle T/n as well as circuits permitting the execution of the various necessary arithmetic operations.

In place of the crown, one may have a stem or a push piece accessible from the exterior of the watch. If a stem is foreseen, it may be imagined that it can be disposed in at least two axial positions in order to obtain a first and second actions. These latter could equally be brought about by a push piece having a sequential program. It is evidently possible to foresee an interior arrangement accessible only during manufacture and reserved to the single purpose of controlling and regulating the operating precision. However, it will have been observed that in one case as in the other, that the process profitably employs a circuit already in the watch, that is to say, the time setting circuit, in order to obtain a totally different function.

As has been seen, the method is based on the result given by the difference in two measurements: the first effected without regulation, the second with regulation of the division rate. There results therefrom immediately a value which is representative of the precision of adjustment and not merely a value indicating the state of the memory which acts on the adjustment unit as is the case of the above cited specifications. The invention may also be applied to a timepiece having only one sense of operation at the rapid rate provided that following a first actuation of the control means there corresponds the connection of the adjustment unit and that following a second actuation thereof there corresponds a disconnection of the said adjustment unit or vice-versa. In the same manner, the invention may be applied to a timepiece having any type of display analog or digital. It suffices to choose measuring apparatus adapted to the one or the other case.

Throughout the preceding description there has been proposed an oscillator for which the chosen frequency is above that of the nominal frequency, the regulation being thus effected by suppression of the excessive pulses. It is evident that the described method would likewise apply to the case where the frequency of the oscillator would be chosen below the nominal frequency in which case the regulation would be effected by the addition of supplementary pulses.

It is further evident that this inspection method is not limited to a succession of operations in accordance with the described order. One may obtain the same result by proceeding initially with the measurement of TQ+nΔT then with the measurement of TQ.

What we claim is:

1. Method for determining the adjustment precision ΔT of an electronic timepiece having an oscillator, a frequency divider chain and an adjustment rate unit adapted to to vary the division rate of the divider chain comprising the steps of:

initially running the display at a rate n times higher than the normal rate with the adjustment unit disconnected;

measuring the real period TQ furnished by the oscillator at the output of the divider chain following a predetermined period T/n defining an adjustment cycle;

running the display a second time at a rate n times higher than the normal rate with the adjustment unit connected;

measuring the real period TQ furnished by the oscillator at the output of the divider chain following the same predetermined period T/n and corrected by the amount nΔT furnished by the adjustment unit to give a result TQ+nΔT;

calculating the difference in value of the two measurements to obtain nΔT; and dividing said difference nΔT by the factor n thereby to obtain the adjustment precision ΔT.

2. Electronic timepiece arranged and adapted for application of the method as set forth in claim 1 comprising an oscillator serving as a time base, an adjustable division rate frequency divider coupled to said oscillator, a time display system arranged to respond to output signals from the frequency divider, an adjustment rate unit coupled to the frequency divider, a memory associated with said adjustment rate unit, the state of said memory representing the magnitude of the adjustment, and time setting means adapted to effect driving of the display system at a rate n times higher than the normal rate following a first actuation of manually actuable control means and at the same time disconnecting the adjustment rate unit from the frequency divider thereby to permit measurement of the real period TQ of the oscillator, a second actuation of said control means reconnecting the adjustment rate unit to the frequency divider thereby to permit measurement of the real period TQ of the oscillator as corrected by the amount $n\Delta T$ furnished by the adjustment rate unit.

3. An electronic timepiece as set forth in claim 2 wherein the control means comprises an internal switch within the timepiece.

4. An electronic timepiece as set forth in claim 2 wherein one of the actuations of the control means effects the rapid driving of the display system in the increasing sense of the display indications and the other actuation of the control means effects the rapid driving of the display system in the decreasing sense of the display indications in order to permit either of time setting or rapid determination of the timepiece adjustment precision.

5. An electronic timepiece as set forth in claim 2 wherein the control means comprises a user accessible crown and the first and second actuations are obtained by rotating the crown in a first and second sense respectively.

6. An electronic timepiece as set forth in claim 2 wherein the control means comprises a user accessible stem which in a first axial position obtains the first actuation and in a second axial position relative to the first obtains the second actuation.

7. A electronic timepiece as set forth in claim 2 wherein the control means comprises a push piece arranged to provide a sequential program of actuations which when first depressed effects the first actuation and when depressed a second time effects the second actuation.

8. An electronic timepiece as set forth in claim 2 wherein the said first actuation effects closing of a first contact and the said second actuation effects closing of a second contact, said first and second contacts acting on the time setting means thereby to connect and disconnect respectively the adjustment rate unit.

* * * * *